US008936988B2

United States Patent
Yin et al.

(10) Patent No.: US 8,936,988 B2
(45) Date of Patent: Jan. 20, 2015

(54) METHODS FOR MANUFACTURING A MOSFET USING A STRESS LINER OF DIAMOND-LIKE CARBON ON THE SUBSTRATE

(71) Applicant: Institute of Microelectronics, Chinese Academy of Sciences, Beijing (CN)

(72) Inventors: Huaxiang Yin, Beijing (CN); Qingqing Liang, Lagrangeville, NY (US); Xiaolong Ma, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/266,521

(22) Filed: Apr. 30, 2014

(65) Prior Publication Data

US 2014/0256109 A1    Sep. 11, 2014

Related U.S. Application Data

(63) Continuation of application No. PCT/CN2012/079177, filed on Jul. 26, 2012.

(30) Foreign Application Priority Data

Jul. 13, 2012  (CN) .......................... 2012 1 0244783

(51) Int. Cl.
   *H01L 21/336*  (2006.01)
   *H01L 21/31*   (2006.01)
   *H01L 29/78*   (2006.01)

(52) U.S. Cl.
   CPC ........ *H01L 29/7847* (2013.01); *H01L 29/7848* (2013.01); *H01L 29/7849* (2013.01); *H01L 29/7845* (2013.01)
   USPC .......................................... 438/300; 438/778

(58) Field of Classification Search
   None
   See application file for complete search history.

(56) References Cited

U.S. PATENT DOCUMENTS 7,629,271 B1 * 12/2009 Wu et al. ................... 438/778
8,143,133 B2 *  3/2012 Hoentschel et al. ........ 438/307
(Continued)

FOREIGN PATENT DOCUMENTS

CN      102097381       4/2013
CN      102479715       4/2014

OTHER PUBLICATIONS

Tan, Kian-Ming, et al., *A High-Stress Liner Comprising Diamond-Like Carbon (DLC) for Strained p-Channel MOSFET* by Kian-Ming Tan etc., IEEE Electron Device Letters, vol. 29, No. 2, Feb. 2008.

(Continued)

*Primary Examiner* — Scott B Geyer
(74) *Attorney, Agent, or Firm* — Knobbe Martens Olson & Bear LLP

(57) ABSTRACT

A method for manufacturing a semiconductor device is disclosed. In one aspect the method includes forming a gate stack over a substrate. The method also includes forming a dummy sidewall spacer around the gate stack. The method also includes depositing a stress liner of diamond-like amorphous carbon (DLC) on the substrate, the gate stack and the dummy sidewall spacer. The method also includes annealing, so that a channel region in the substrate below the gate stack and the gate stack memorize stress in the stress liner. The method also includes removing the dummy sidewall spacer. The method also includes forming a sidewall spacer around the gate stack. In the method according to the disclosed technology, large stress in the liner of DLC is memorized and applied to the dummy gate stack and the channel region.

14 Claims, 4 Drawing Sheets

(56) References Cited

U.S. PATENT DOCUMENTS

| | | |
|---|---|---|
| 2002/0028392 A1 | 3/2002 | Jin et al. |
| 2007/0032024 A1* | 2/2007 | Peidous et al. ............... 438/299 |
| 2009/0116193 A1 | 5/2009 | Lin |
| 2010/0213554 A1 | 8/2010 | Wang et al. |

OTHER PUBLICATIONS

International Search Report dated Apr. 11, 2013 received in International Application No. PCT/CN2012/079177.

* cited by examiner

METHODS FOR MANUFACTURING A MOSFET USING A STRESS LINER OF DIAMOND-LIKE CARBON ON THE SUBSTRATE

RELATED APPLICATIONS

This application claims priority to International Application No. PCT/CN2012/079177, filed on Jul. 26, 2012, entitled "METHOD FOR MANUFACTURING SEMICONDUCTOR DEVICE," and Chinese Patent Application No. 201210244783.9, filed on Jul. 13, 2012, entitled "MOSFET FOR MANUFACTURING SEMICONDUCTOR DEVICE", which are incorporated herein by reference in their entirety.

BACKGROUND

1. Field

The disclosed technology relates to a method for manufacturing a semiconductor device, and particularly to a method for manufacturing a MOSFET using a blanket layer with large stress.

2. Description of the Related Technology

When a feature size of a semiconductor device is being scaled down from the 90 nm CMOS integrated circuit process, stress channel engineering plays a more and more important role for increasing carrier mobility in a channel. Various processes for inducing uniaxial stress, i.e. compressive stress or tensile stress in a channel direction, are applied to the method for manufacturing a semiconductor device to increase carrier mobility and improve performances of the semiconductor device. For example, in the 90 nm CMOS process, the compressive stress is introduced in a PMOS device by embedded SiGe (e-SiGe) source/drain regions, or by a 100 substrate with a tensile contact etch stop layer (tCESL). In the 65 nm CMOS process, a first-generation source/drain stress memorization technique ($SMT^{\times 1}$) is used on the basis of the 90 nm CMOS process, in which double etching stop layers are used. In the 45 nm CMOS process, a second-generation source/drain stress memorization technique ($SMT^{\times 2}$) is used on the basis of the previous generation of the CMOS process, in which an e-SiGe technique is used in combination with a single tCESL or double tCESLs, and a stress proximity technique (SPT) is also used. Moreover, a 110 substrate is used for a PMOS device and a 100 substrate is used for an NMOS device. Beyond the 32 nm CMOS process, a third-generation source/drain stress memorization technique ($SMT^{\times 3}$) is used on the basis of the previous generation of the CMOS process, in which tensile stress in the NMOS device is enhanced by embedded SiC source/drain regions.

Moreover, the techniques of introducing stress into the channel region may be implemented by controlling materials and profiles of a channel region or a sidewall spacer, instead of varying materials of the substrate and/or source/drain regions. As an example, a double stress liner (DSL) technique may be used, in which a sidewall spacer of $SiN_x$ is used for introducing tensile stress in an NMOS device and a compress-stress sidewall spacer is used for introducing compressive stress in a PMOS device. As another example, the embedded SiGe source/drain regions may be formed as having a cross section of Σ shape to improve the stress in a channel region of a PMOS device.

However, effects of these conventional stress techniques may be impaired when a feature size of a semiconductor device is further scaled down. For an NMOS device, misalignment and deviation of various films, which introduce stress, will be more serious when the features size of the semiconductor device is further scaled down. In turn, it requires that the films have small thicknesses while introducing large stress. For a PMOS device, carrier mobility in a channel region remarkably depends on a feature size of a semiconductor device in the technique using embedded SiGe source/drain regions. Scaling down of the feature size impairs the effect of increasing carrier mobility.

A novel idea is to use a diamond-like amorphous carbon (DLC) film to increase intrinsic stress of the device. For example, an article entitled "*A High-Stress Liner Comprising Diamond-Like Carbon (DLC) for Strained p-Channel MOSFET*" by Kian-Ming Tan etc., IEEE ELECTRON DEVICE LETTERS, VOL. 29, NO. 2, FEBRUARY 2008, discloses that DLC, which has compressive stress larger than SiN, covers the whole surface of a MOSFET. The larger compressive stress of the DLC may be transferred to an underlying channel region to increase carrier mobility of a channel region and improve performances of the semiconductor device. Moreover, a US patent application No. US2010/0213554A1 discloses a similar structure.

Conventionally, the DLC is formed by magnetically filtered cathodic vacuum arc (FCVA). The DLC is more like diamond than graphite by increasing a ratio of $SP^3$ bond, and in turn has increased intrinsic stress. However, the FCVA process for forming the DLC with large stress is not a standard process used in integrated circuits. For example, it is incompatible with a conventional CMOS process. Additional manufacture apparatus, processes and time may be needed. Moreover, the FCVA process generates many particles which adversely affect the following processes. The particles remaining in a fine structure cause undesired electrical conduction or insulation, or uneven thickness of the film to be formed, or variations of the device due to thermal stress, and so on. Consequently, reliability of the device may be poor. Alternatively, the inventor proposes in a previous patent application that high-quality DLC may be deposited by plasma enhanced chemical vapor deposition (PECVD), magnetron sputtering, or the like and magnitude of stress of the DLC may be adjusted by controlling the process parameters.

However, no matter what kind of process the DLC is formed with, there are many difficulties in using the DLC as a stress liner, because the DLC is a diamond-like amorphous carbon film in its nature, and has high hardness and poor step coverage. One difficulty is foreseeable that a DLC stress layer may have a small thickness (for example, about 10-50 nm) due to an overall size of the semiconductor device, if the DLC stress layer covers a gate, a sidewall spacer and source/drain regions. The DLC stress layer may have a smaller thickness or even does not remain near a lower portion of the sidewall spacer where the sidewall spacer adjoins the source/drain regions, because the DLC stress layer has poor step coverage. The portion of the DLC stress layer is close to a channel region of the device, but may have a thickness insufficient for applying large stress to the channel region. Consequently, carrier mobility may not be increased as required, which results in unfavorable performances of the device. Moreover, when DLC is used in a sidewall spacer instead of SiN, the sidewall spacer may crack or flake at a sidewall of a gate due to improper process control, in a case that the sidewall spacer should have a small thickness. Consequently, the sidewall spacer may achieve no effect of applying stress to the channel region.

Thus, the previous techniques of introducing high stress by DLC have the drawback of poor step coverage, and are difficult to effectively increase carrier mobility in the channel region and effectively improve driving capability of the device.

SUMMARY OF CERTAIN INVENTIVE ASPECTS

One object of the disclosed technology is to provide a method for manufacturing a semiconductor device which effectively applies stress to a channel region to increase carrier mobility.

For this purpose, a method of manufacturing a semiconductor device is disclosed. The method includes forming a gate stack over a substrate. The method also includes forming a dummy sidewall spacer around the gate stack. The method also includes depositing a stress liner of diamond-like carbon (DLC) on the substrate, the gate stack and the dummy sidewall spacer. The method also includes annealing so that a channel region in the substrate below the gate stack and the gate stack memorize stress in the stress liner. The method also includes removing the dummy sidewall spacer. The method also includes forming a sidewall spacer around the gate stack.

For some embodiments, the gate stack may be a dummy gate stack comprising an oxide liner and a dummy gate conductor layer, and wherein the dummy gate conductor layer is made of at least one selected from a group consisting of polycrystalline silicon, amorphous silicon and microcrystalline silicon.

For some embodiments, the dummy sidewall spacer and/or the sidewall spacer may be made of at least one selected from a group consisting of silicon nitride and silicon oxynitride.

For some embodiments, after forming the dummy sidewall spacer, the method may further comprise forming source and drain regions in the substrate on both sides of the dummy sidewall spacer.

For some embodiments, the source and drain regions may comprise lightly doped source and drain extension regions and/or source and drain halo regions, and heavily doped source and drain regions.

For some embodiments, the source and drain regions may be source and drain regions with stress and comprise SiGe or Si:C.

For some embodiments, the source and drain regions may further comprise raised source and drain regions grown epitaxially.

For some embodiments, the stress liner of DLC may be formed by (plasma enhanced chemical vapor decomposition (PECVD) or magnetron sputtering.

For some embodiments, the annealing may comprise: laser annealing at about 1100-1300° C. for an annealing time of about 5 ms-50 ms, or spike rapid thermal annealing at about 1000-1100° C. for an annealing time of about 500 ms-2 s.

For some embodiments, after forming the sidewall spacer, the method may further comprise: forming a metal silicide in the source and drain regions; forming a contact etch stop layer on the metal silicide, the sidewall spacer and the gate stack; forming an interlayer dielectric on the contact etch stop layer; and planarizing the interlayer dielectric to expose the gate stack.

For some embodiments, after planarizing the interlayer dielectric to expose the gate stack, the method may further comprise: removing the gate stack by etching to form a gate trench; depositing a gate dielectric layer of a high-K material in the gate trench; depositing a gate conductor layer on the gate dielectric layer in the gate trench; and planarizing the gate conductor layer to expose the interlayer dielectric.

For some embodiments, after planarizing the gate conductor layer to expose the interlayer dielectric, the method may further comprise: forming a second contact etch stop layer and a second interlayer dielectric in sequence on the interlayer dielectric; etching the second interlayer dielectric, the second contact etch stop layer, the first interlayer dielectric, and the first contact etch stop layer to expose the metal silicide, so that source and drain contact holes are formed; and filling the source and drain contact holes with a metal to form source and drain contact plugs.

In the method for manufacturing the semiconductor device according to the disclosed technology, large stress in the liner of DLC is memorized and applied to the dummy gate stack and the channel region to increase carrier mobility and improve performances of the device.

BRIEF DESCRIPTION OF THE DRAWINGS

The solutions according to the disclosed technology will be described in detail with reference to the drawings, in which.

DETAILED DESCRIPTION OF CERTAIN ILLUSTRATIVE EMBODIMENTS

Technical features and effects of the solutions according to the disclosed technology, which is directed to methods for manufacturing a semiconductor device having stress well controlled in a channel region, increased carrier mobility and improved performances, will be explained in exemplary embodiments with reference to attached drawings. It should be noted that similar reference numbers denote similar structures. The terms "first", "second", "upper", and "lower" may be used in the present application for describing various structures of the device and various steps of the process. However, these words do not imply any spatial, sequential or hierarchy relation of various structures of the device and various steps of the process, unless the context clearly indicates otherwise.

Hereinafter, various steps of a method for manufacturing a semiconductor device according to the disclosed technology will be described in detail with reference to the cross-sectional views in FIGS. 1 to 10 and the flowchart in FIG. 11.

Referring to FIG. 11 and FIGS. 1 to 3, a (dummy) gate stack and a dummy sidewall spacer are formed on a substrate, and source and drain regions are formed on both sides of the (dummy) gate stack.

Figure 1:
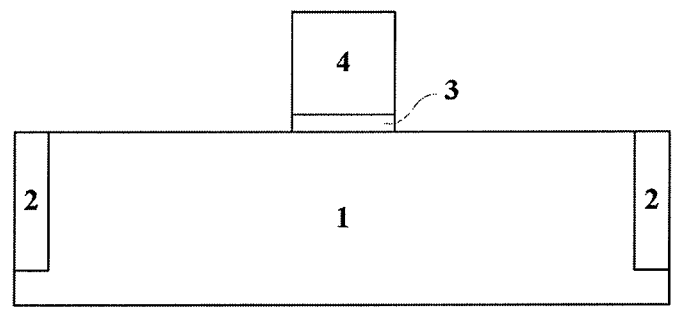
FIGS. 1 to 10 show cross-sectional views of semiconductor structures at various stages of the method for manufacturing a semiconductor device according to the disclosed technology.

As shown in FIG. 1, the (dummy) gate stack is formed over the substrate. The substrate 1 is firstly provided. The substrate 1 may be selected in view of an application of the device, from a group consisting of monocrystalline silicon (Si), silicon on insulator (SOI), monocrystalline germanium (Ge), germanium on insulator (GeOI), strained silicon, silicon germanium (SiGe), compound semiconductor materials such as gallium nitride (GaN), gallium arsenide (GaAs), indium phosphide (InP), indium antimonide (InSb), and carbon based semiconductors such as graphene, SiC, carbon nanotubes etc. For some embodiments, the substrate 1 may be bulk Si or SOI, so as to be compatible with the CMOS process and used in a large-scale integrated circuit.

A shallow trench isolation (STI) 2 is formed in the substrate 1. For example, a shallow trench is firstly formed by photolithography and etching. The shallow trench is then filled with an insulating isolation material, by a conventional deposition process such as low pressure chemical vapor deposition (LPCVD), plasma enhanced chemical vapor deposition (PECVD), or the like. Finally, the insulating isolation material is planarized by chemical mechanical polishing (CMP) to expose the substrate 1 and form the STI 2. The insulating isolation material in the STI 2 may be a conventional insulating material selected from a group consisting of oxides, nitrides, oxynitrides, and the like. The insulating isolation material may also be a material which has colossal (positive/negative) thermal expansion coefficient (i.e. an absolute value of a linear volume thermal expansion coefficient at 100K> $10^{-4}$/K). For example, the insulating isolation material may be one selected from a group consisting of $Bi_{0.95}La_{0.05}NiO_3$, $BiNiO_3$, $ZrW_2O_8$, $Ag_3[Co(CN)_6]$, and the like. In such case, the insulating isolation material applies stress to the channel region and further increases carrier mobility.

A gate dielectric layer 3 and a gate conductor layer 4 are deposited in sequence on the whole surface of the wafer, and then etched to form a gate stack (3/4). In one embodiment of the disclosed technology, a gate-last process is used, in which the above gate stack is a dummy gate stack and will be removed in a subsequent step. For some embodiments, the gate dielectric layer 3 may be a liner of silicon oxide. For some embodiments, the gate conductor layer 4 may be a dummy gate conductor layer which is made of one selected from a group consisting of polysilicon, amorphous silicon and microcrystalline silicon.

It should be noted that a gate-first process may also be used in other embodiments of the disclosed technology, instead of the gate-last process. In the gate-first process, the gate stack is kept in the subsequent steps. For some embodiments, the gate dielectric layer 3 may be made of silicon oxide, nitrogen-doped silicon oxide, silicon nitride, or a high-K material, where k is the relative dielectric constant of the material. The high-K material may include, but not limited to, a hafnium base material selected from a group consisting of $HfO_2$, $HfSiO_x$, $HfSiON$, $HfAlO_x$, $HfTaO_x$, $HfLaO_x$, $HfAlSiO_x$, $HfLaSiO_x$ (where the content x of oxygen can be changed as required, in view of ratios and chemical valences of multiple metal components, and has a value in the range of 1 to 6, but not limited to an integer number), a rare earth based high-K dielectric material selected from a group consisting of $ZrO_2$, $La_2O_3$, $LaAlO_3$, $TiO_2$, $Y_2O_3$, and the like, or a composite layer of $Al_2O_3$ and any of the above materials. The gate conductor layer 4 may be made of polysilicon, poly-silicon germanium, or a metal. The metal for the gate conductor layer 4 may include, but not limited to, a pure metal selected from a group consisting of Co, Ni, Cu, Al, Pd, Pt, Ru, Re, Mo, Ta, Ti, Hf, Zr, W, Ir, Eu, Nd, Er, La, and the like, or an alloy thereof, and a nitride thereof. The gate conductor layer 4 may be doped with C, F, N, O, B, P, As, or the like for tuning work function. For some embodiments, a barrier layer (not shown) of nitride may be formed between the gate conductor layer 4 and the gate dielectric layer 3 by a convention process such as physical vapor deposition (PVD), chemical vapor deposition (CVD), atomic layer deposition (ALD), or the like. The barrier layer may be made of $M_xN_y$, $M_xSi_yN_z$, $M_aAl_yN_z$, or $M_aAl_xSi_yN_z$, where M is an element selected from a group consisting of Ta, Ti, Hf, Zr, Mo, W and the like. For some embodiments, the gate conductor layer 4 and the barrier layer may have a mixed doped layer structure, instead of a multi-layer structure including various layers stacked one on another. In the mixed doped layer structure, materials of the gate conductor layer 4 and the barrier layer are deposited simultaneously on the gate dielectric layer 3. In other words, the gate conductor layer also comprises the material of the above barrier layer.

Figure 2:
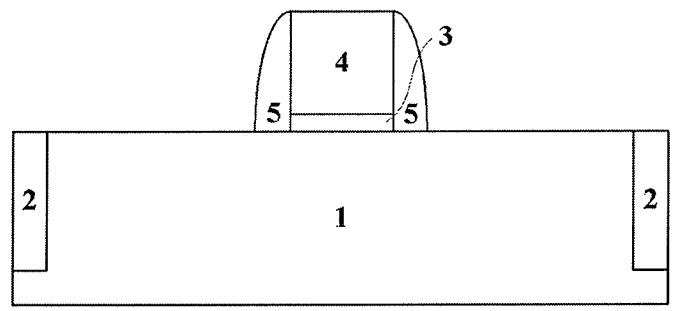

As shown in FIG. 2, a dummy sidewall spacer 5 is formed on the substrate 1 around the (dummy) gate stack 3/4. An insulating layer of silicon nitride or silicon oxynitride is deposited on the substrate 1 and the gate stack 3/4 by a conventional process such as PECVD, high density plasma chemical vapor deposition (HDPCVD), or the like, and is then formed as the dummy sidewall spacer 5 by photolithography and etching. The dummy sidewall spacer 5 defines locations of the source and drain regions and a DLC film to be formed in a DLC SMT process. The dummy sidewall spacer 5 determines quality of the DLC film.

Figure 3:
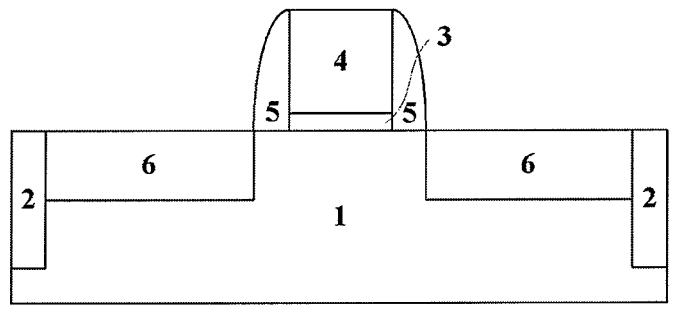

For some embodiments, the source and drain regions 6 may be formed in the substrate 1 on both sides of the dummy sidewall spacer 5, as shown in FIG. 3. A first source/drain implantation may be performed before the dummy sidewall spacer 5 is formed in FIG. 2. Dose and energy in the first source/drain implantation may be selected to have small values for forming source and drain extension regions (not shown), which are lightly doped to a first conductivity type (for example, n– or p–), and/or source and drain halo regions (not shown). A second source/drain implantation may be performed after the dummy sidewall spacer 5 is formed in FIG. 2. Does and energy in the second source/drain implantation may be selected to have large values for forming source and drain regions which are heavily doped to the first conductivity type (for example, n– or p–). The source and drain region 6 in FIG. 3 may include the above lightly-doped source and drain extension regions, the above source and drain halo regions and the above heavily-doped source and drain region. The portion of the substrate 1 between the source and drain regions forms a channel region. Ions of P, As, Sb or the like may be implanted for an NMOS device, and ions of B, Al, Ga, In or the like may be implanted for a PMOS device. It should also be noted that a plurality of PMOS devices and a plurality of NMOS devices and other devices may be formed simultaneously on a single substrate to provide a CMOS device, an memory array, a light sensor array, or the like, though only one MOSFET is illustrated in the flowchart of the method according to the disclosed technology.

Instead of the source and drain regions 6 formed by the conventional ion implantation, embedded source and drain regions 6 with stress may also be formed. Specifically, with the dummy sidewall spacer 5 as a mask, portions of the substrate 1 on both sides of the dummy sidewall spacer 5 are etched to form source and drain trenches (not shown), by plasma etching or wet etching using tetramethylammonium hydroxide (TMAH). A stress layer of SiGe or Si:C is epitaxially grown in the source and drain trenches. The stress layer has a lattice constant different from that of Si in the channel region, and thus applies stress to the channel region. The stress layer forms the source and drain regions 6 with stress. For some embodiments, the source and drain regions 6 with stress may be in-situ doped during epitaxial growth, or may be doped in the above source and drain implantation after the source and drain regions 6 with stress are formed. The source and drain regions 6 are of the first conductivity type.

Moreover, instead of the source and drain regions in FIG. 3, which are parallel to the surface of the substrate, raised source and drain regions (not shown) may be formed by epitaxial growth to reduce source/drain contact resistance and further improve performances of the device.

Figure 4:
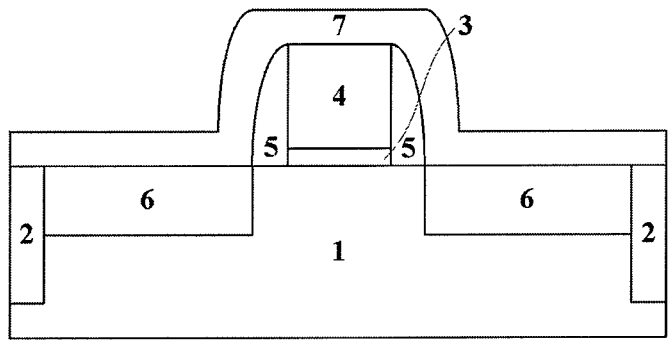
Figure 5:
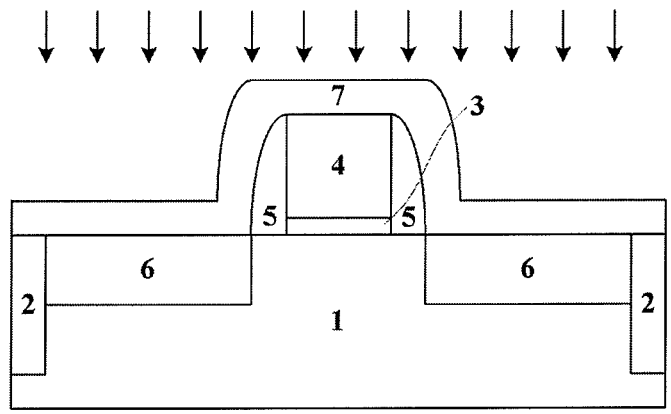
Figure 11:
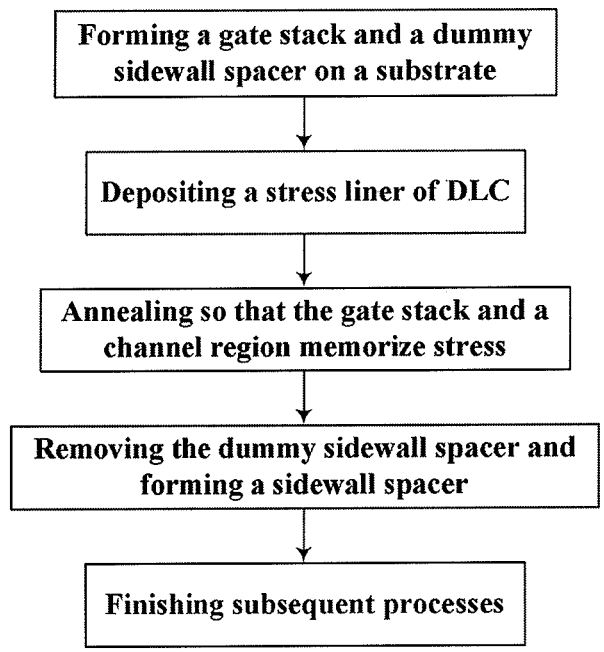
FIGS. 11 and 12 are a flowcharts illustrating methods for manufacturing a semiconductor device according to the disclosed technology.

Referring to FIG. 11 and FIGS. 4 and 5, a DLC stress liner may be formed. After annealing, the channel region and the gate stack memorize the stress.

As shown in FIG. 4, the stress liner 7 is formed on the whole semiconductor structure to cover the STI 2, the source and drain regions 6, the dummy sidewall spacer 5 and the gate conductor layer 4. The stress liner 7 may be made of diamond-like amorphous carbon (DLC) which is deposited by magnetically filtered cathodic vacuum arc (FCVA) as mentioned above, preferably here by PECVD or magnetron sputtering. Material properties of the DLC film depend remarkably on a ratio of $SP^3$ bond. The higher the ratio of the $SP^3$ bond is, the more like diamond the DLC film is than graphite. Thus, the DLC film that has a higher ratio of the $SP^3$ bond will increase intrinsic stress. Specifically, in a preferable embodiment of the disclosed technology, process parameters is controlled such that the ratio of the $SP^3$ bond is at least more than about 50%, the content of hydrogen atoms is less than about 40%, and the content of nitrogen atoms is less than about 20%. Thus, the stress liner 7 has (tensile or compressive) stress with an absolute value of magnitude larger than 2 GPa, and preferably in the range of 4-10 GPa. Magnetron sputtering and PECVD are mainstream CMOS processes and easy to control film quality by varying process parameters. These processes may be used for forming a multi-element alloy film with fewer particles and good conformality. Therefore, the DLC film formed by these processes has better quality than that formed by FCVA. As an example, a sapphire target may be used for forming the DLC film in a magnetron process. Ar may be introduced into a sputtering chamber at a flow rate of about 10-200 sccm, with the addition of $CH_4$ at a flow rate of about 1-200 sccm. The sputtering chamber is controlled at a pressure of about $10^{-5} \sim 10^{-2}$ torr and at a temperature of about 500° C. RF or DC power in the sputtering process is controlled to be about 50~1000 W. As another example, $CH_4$ or $C_6H_6$ may be used for forming the DLC film in a PECVD process. The reaction chamber is controlled at a pressure of about $10^{-5} \sim 1$ torr and at a temperature of about 300-700° C. RF or DC power in the PECVD process is controlled to be about 500 W~10 kW. It should be noted that although the process parameters for forming the DLC film are given above, other process parameters may also be used if the resultant film has high quality. A thickness of the stress liner 7 of DLC may be about 10~200 nm, and for some embodiments about 30~100 nm.

For some embodiments, when the stress liner 7 of DLC is formed by magnetron sputtering or PECVD, metal elements, such as Co, Ni, Cu, Al, Pd, Pt, Ru, Re, Mo, Ta, Ti, Hf, Zr, W, Ir, Eu, Nd, Er, La etc., may be doped in situ for tuning the stress.

As shown in FIG. 5, annealing is performed so that the channel region and the gate stack memorize the stress of the stress liner 7. After the stress liner 7 of DLC is formed as shown in FIG. 4, it applies the stress to the gate stack and the channel region. For example, the annealing may be laser annealing at about 1100-1300° C., for some embodiments, about 1200° C., for an annealing time of about 5 ms-50 ms, for some embodiments, about 10 ms, or spike rapid thermal annealing (RTA) at about 1000-1100° C., for some embodiments, about 1050° C., for an annealing time of about 500 ms-2 s, for some embodiments, about 1 s. In this way, crystal lattices of the gate stack (especially the gate conductor layer 4) and the channel region, which are made of polysilicon/microcrystalline silicon and monocrystalline silicon respective, are rearranged locally. The gate conductor layer 4 and the channel region thus memorize the stress of the stress liner 7. In other words, the stress is transferred from the stress liner 7 of DLC to the gate conductor layer 4 and the channel region. The stress memorized by the gate conductor layer 4 and the channel region may be less than or equal to the original stress of the stress liner 7 of DLC, e.g. may be only 2. 5-6 GPa.

Figure 6:
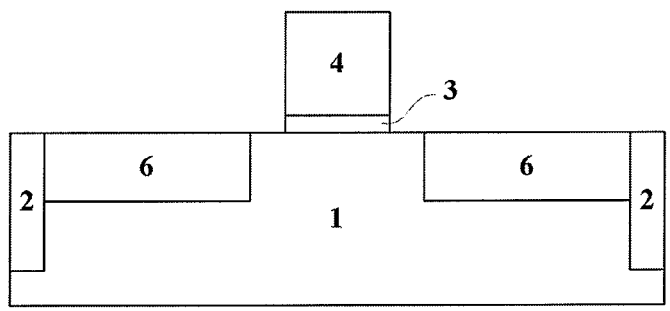
Figure 7:
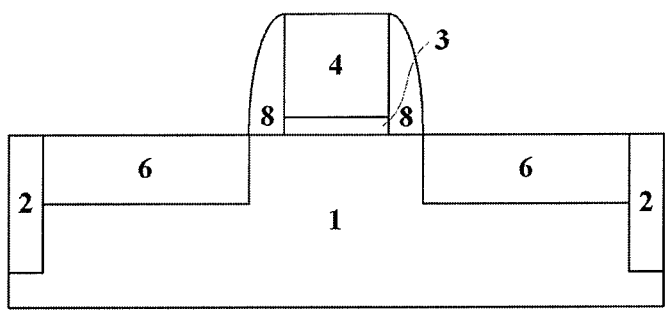

Referring to FIG. 11 and FIGS. 6 and 7, the dummy sidewall spacer 5 may be removed and a sidewall spacer 8 may be formed.

As shown in FIG. 6, the dummy sidewall spacer 5 may be removed by etching. Plasma etching may be used in view of the material of the dummy sidewall spacer 5. Process parameters of the plasma etching, such as etching gases, flow rates, pressure, power etc., may be controlled to provide etching selectivity. The ratio of an etching rate of the dummy sidewall spacer 5 (which is made of silicon nitride, silicon oxynitride) to an etching rate of the surrounding materials (which may be silicon, silicon oxide etc.) may be larger than 10:1. The etching rate and the etching time may be controlled so that the dummy sidewall spacer 5 is completely removed but the gate conductor layer 4 and the source and drain regions 6 are substantially not etched. Alternatively, the dummy sidewall spacer 5 may be removed by wet etching using hot phosphoric acid or using sulphuric acid and hydrogen peroxide.

As shown in FIG. 7, the sidewall spacer 8 may be formed by a conventional process. The sidewall spacer 8 may be formed by those processes for forming the dummy sidewall spacer 5, including depositing silicon nitride or silicon oxynitride by PECVD, HDPCVD, or the like, and then etching. The conventional material of the sidewall spacer 8 is soft and has good step coverage, which guarantees insulating isolation. Alternatively, a layer of DLC may be formed by PECVD or magnetron sputtering and etched by plasma etching to form the sidewall spacer 8, which further increases the stress of the channel region. Different from the stress liner of DLC, the sidewall spacer 8 of DLC may have a smaller thickness and higher hardness. In order to ensure good coverage of the sidewall spacer, regardless of its material, a liner (not shown) of silicon oxide and/or silicon nitride may be deposited before the sidewall spacer 8 of DLC is deposited.

It should be noted that in the steps shown in FIGS. 4-7, the stress liner 7 of DLC may have a thickness larger than that of a blanket stress layer in the prior art, because both the dummy sidewall spacer 5 and the stress liner 7 of DLC may be firstly formed and then completely removed after the stress is memorized. Thus, the disadvantage of poor step coverage of the DLC layer may be overcome by increasing the thickness of the DLC layer.

Hereinafter, the subsequent steps shown in FIG. 11 and FIGS. 8-10 may be followed.

Figure 8:
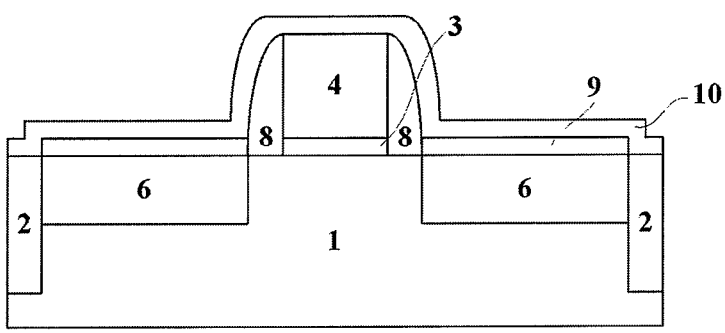

As shown in FIG. 8, a metal silicide 9 may be formed in/on the source and drain regions 6, and a contact etch stop layer 10 may be formed on the whole device. With the sidewall spacer 8 as a mask, self-aligned silicidation may be performed by depositing a layer of a metal such as Pt, Co, Ni, Ti, etc., or an alloy thereof, on the whole surface of the device, and then performing high temperature annealing. The silicon in the source and drain regions 6 reacts with the metal to form the metal silicide 9, such as $CoSi_2$, $TiSi_2$, NiSi, PtSi, NiPtSi, CoGeSi, TiGeSi, NiGeSi etc., to reduce source/drain contact resistance and further improve performances of the device. An insulating layer of silicon nitride or silicon oxynitride may be formed by PECVD, HDPCVD or the like to form a contact etch step layer (CESL) 10 which covers the STI 2, the metal silicide 9, the sidewall spacer 8 and the gate conductor layer 4 etc. The CESL 10 protects the source and drain regions and the metal silicide in the subsequent etching or planarizing process.

Figure 9:
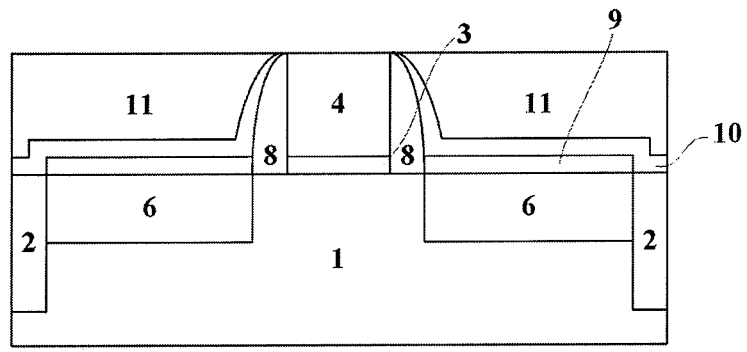

As shown in FIG. 9, an interlayer dielectric (ILD) 11 may be deposited and planarized to expose the gate conductor layer 4. For some embodiments, the ILD 11 may be made of a low-K material which may be but not limited to an organic low-K material (e.g. an organic polymer containing aryl group or polycyclic group), an inorganic low-K material (e.g. an amorphous carbon nitride film, a polycrystalline boron nitride film, silicon fluoride glass, borosilicate glass (BSG), phosphosilicate glass (PSG), or borophosphosilicate glass (BPSG), a porous low-K material (e.g. silsesquioxane (SSQ) porous low-K material, porous silicon dioxide, porous SiOCH, C-doped silicon dioxide, F-doped porous amorphous carbon, porous diamond, or porous organic polymer). The low-K ILD 11 may be formed by spin coating, spray coating, screen printing, LPCVD etc. Then, the ILD 11 may be planarized by CMP or etched back to expose the gate conductor layer 4.

Figure 10:
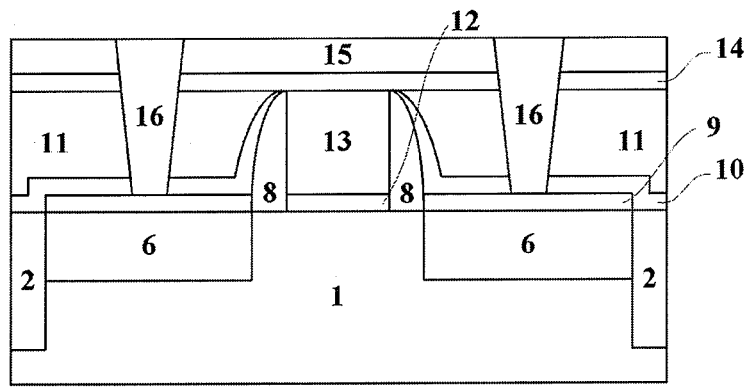

As an example of the gate-last process, the subsequent step shown in FIG. 10 may be followed. The dummy gate conductor layer 4 of polysilicon, microcrystalline silicon, or amorphous silicon may be removed by etching using TMAH, or by dry etching such as plasma etching. The gate dielectric layer (i.e. oxide liner) 3 of silicon oxide may be removed by wet etching using HF or dry etching such as plasma etching. Consequently, a gate trench is left in the ILD 11 and defined by the sidewall spacer 8. A gate dielectric layer 12 of high-K material may be deposited by PECVD, HDPCVD, (metal organic chemical vapor deposition) MOCVD, MBA, ALD etc. in the gate trench. The high-K material may be but not limited to nitride (e.g. SiN, AlN, TiN), metal oxide (mainly be group B and lanthanide metal oxide, e.g. $Al_2O_3$ $Ta_2O_5$, $TiO_2$, ZnO, $ZrO_2$, $HfO_2$, $CeO_2$, $Y_2O_3$, $La_2O_3$), perovskite-type oxide (e.g. $PbZr_xTi_{1-x}O_3(PZT)$, $Ba_xSr_{1-x}TiO_3(BST)$). A gate conductor layer 13 may be deposited by MOCVD, evaporation, and sputtering on the gate dielectric layer 12 in the gate trench, and may fill the gate trench. The gate conductor layer 13 may be a single layer or multi-layer. The gate conductor layer 13 may be made of polysilicon, poly-silicon germanium, or a metal. The metal for the gate conductor layer 13 may include, but not limited to, a pure metal selected from a group consisting of Co, Ni, Cu, Al, Pd, Pt, Ru, Re, Mo, Ta, Ti, Hf, Zr, W, Ir, Eu, Nd, Er, La, and the like, or an alloy thereof, and a nitride thereof. The gate conductor layer 13 may be doped with C, F, N, O, B, P, As, or the like for tuning work function. For some embodiments, a barrier layer (not shown) of nitride may be formed between the gate conductor layer 13 and the gate dielectric layer 12 by a convention process such as PVD, CVD, ALD, or the like. The barrier layer may be made of $M_xN_y$, $M_xSi_yN_z$, $M_xAl_yN_z$, or $M_aAl_xSi_yN_z$, where M is an element selected from a group consisting of Ta, Ti, Hf, Zr, Mo, W and the like. Then, the gate conductor layer 13 and the gate dielectric layer 12 may be planarized to expose the ILD 11. A second contact etch stop layer (i.e. the second CESL) 14 of silicon nitride and a second interlayer dielectric (i.e. the second ILD) 15 of a low-K material may be formed by deposition. The second ILD 15, the second CESL 14 and the first CESL 10 are etched in sequence to form source and drain contact holes which expose the metal silicide 9. The source and drain contact holes may be filled with metals such as W, Al, Ti, Mo, Ta, Cu etc. and nitrides thereof by evaporation, sputtering, MOCVD etc. to form source and drain contact plugs 16. As a result, the process of manufacturing MOSFET according to the embodiment of the disclosed technology has been completed.

Although the attached drawings of the disclosed technology only schematically show an NMMOS or PMOS device having a planar channel region, one skilled person in the art should appreciate that the disclosed technology may also be applied to a CMOS structure, and other device structures, such as 3-D multigate, vertical channel, nanowires etc.

In the method for manufacturing the semiconductor device according to the disclosed technology, large stress in the liner of DLC is memorized and applied to the dummy gate stack and the channel region to increase carrier mobility and improve performances of the device.

Figure 12:
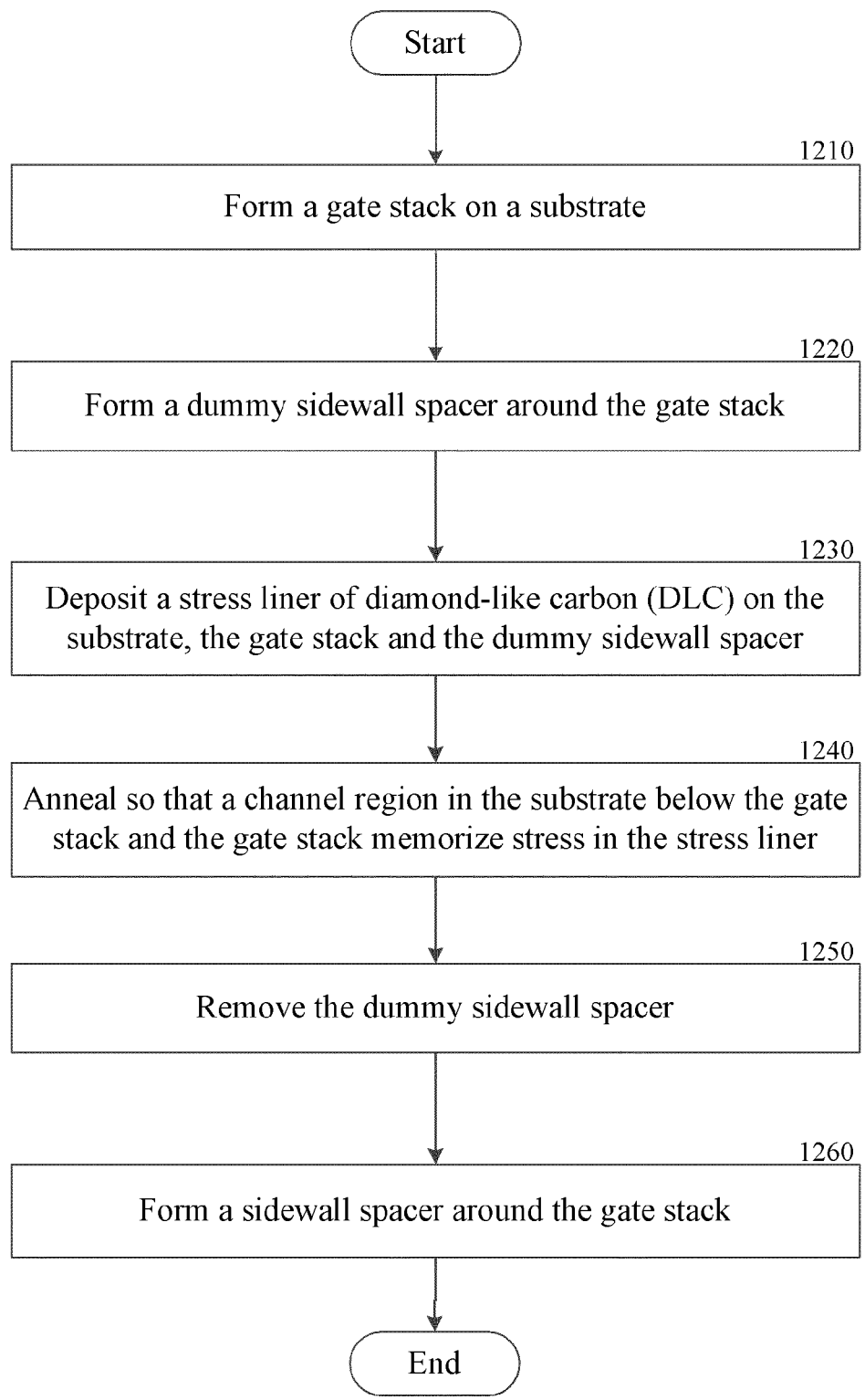

Manufacturing the semiconductor device shown in FIG. 10 using the process flow depicted in FIGS. 1-10 will now be described with respect to FIG. 12, which is a flowchart illustrating a method 1200 of manufacturing a semiconductor device. At block 1210, method 1200 forms a gate stack (3/4) on a substrate 1. At block 1220, method 1200 forms a dummy sidewall spacer 5 around the gate stack (3/4). At block 1230, method 1200 deposits a stress liner 7 of diamond-like carbon (DLC) on the substrate 1, the gate stack (3/4), and the dummy sidewall spacer 5. At block 1240, method 1200 anneals so that a channel region in the substrate below the gate stack and the gate stack (3/4) memorize stress in the stress liner 7. At block 1250, method 1200 removes the dummy sidewall spacer 5. At block 1260, method 1200 forms sidewall spacer 8 around the gate stack (3/4).

The present invention has been described above with reference to one or more embodiments thereof. It should be understood that various modifications, alternations and additions can be made to the device structure by one skilled person in the art without departing from the spirits and scope of the present invention. Moreover, the teachings of the present disclosure may make various modifications which may be adapted for particular situations or materials without departing from the spirits and scope of the present invention. Therefore, the object of the present invention is not limited to the above particular embodiments. The device structure and the manufacture method thereof as disclosed will include all of embodiments falling within the scope of the present invention.

What is claimed is:

1. A method of manufacturing a semiconductor device, comprising:
   forming a gate stack on a substrate;
   forming a dummy sidewall spacer around the gate stack;
   depositing a stress liner of diamond-like carbon (DLC) on the substrate, the gate stack and the dummy sidewall spacer;
   annealing so that a channel region in the substrate below the gate stack and the gate stack memorize stress in the stress liner;
   removing the dummy sidewall spacer; and
   forming a sidewall spacer around the gate stack.

2. The method according to claim 1, wherein the gate stack is a dummy gate stack comprising an oxide liner and a dummy gate conductor layer, the dummy gate conductor layer is formed of at least one of polycrystalline silicon, amorphous silicon and microcrystalline silicon.

3. The method according to claim 1, wherein the dummy sidewall spacer and/or the sidewall spacer is formed of silicon nitride and/or silicon oxynitride.

4. The method according to claim 1, further comprising forming source and drain regions in the substrate on both sides of the dummy sidewall spacer.

5. The method according to claim 4, wherein the source and drain regions comprise at least one of lightly doped source and drain extension regions, source and drain halo regions, and heavily doped source and drain regions.

6. The method according to claim 4, wherein the source and drain regions comprise a stress layer, the stress layer formed of SiGe or Si:C.

7. The method according to claim 4, wherein the source and drain regions further comprise raised source and drain regions formed by epitaxial growth.

8. The method according to claim 4, further comprising:
forming a metal silicide in the source and drain regions;
forming a first contact etch stop layer on the metal silicide, the sidewall spacer and the gate stack;
forming a first interlayer dielectric on the first contact etch stop layer; and
planarizing the first interlayer dielectric to expose the gate stack.

9. The method according to claim 8 further comprising:
removing the exposed gate stack by etching to form a gate trench;
depositing a gate dielectric layer of a high-K material in the gate trench;
depositing a gate conductor layer on the gate dielectric layer in the gate trench; and
planarizing the gate conductor layer to expose the first interlayer dielectric.

10. The method according to claim 8, further comprising:
forming a second contact etch stop layer and a second interlayer dielectric in sequence on the first interlayer dielectric;
etching the second interlayer dielectric, the second contact etch stop layer, the first interlayer dielectric, and the first contact etch stop layer in sequence to expose the metal silicide, so that source and drain contact holes are formed; and
filling the source and drain contact holes with a metal to form source and drain contact plugs.

11. The method according to claim 1, wherein the stress liner is formed by plasma enhanced chemical vapor deposition (PECVD) or magnetron sputtering.

12. The method according to claim 1, wherein the annealing comprises laser annealing or spike rapid thermal annealing.

13. The method according to claim 12, wherein the laser annealing comprises laser annealing at about 1100-1300° C. for an annealing time of about 5 ms-50 ms.

14. The method according to claim 12, wherein the spike rapid thermal annealing comprises spike rapid thermal annealing at about 1000-1100° C. for an annealing time of about 500 ms-2s.

* * * * *